United States Patent [19]
Rybarczk

[11] 3,728,469
[45] Apr. 17, 1973

[54] CAVITY STRUCTURE

[75] Inventor: Frederick Rybarczk, Toledo, Ohio
[73] Assignee: Owens-Illinois, Inc., Toledo, Ohio

[22] Filed: Mar. 11, 1971
[21] Appl. No.: 123,201

[52] U.S. Cl. ................174/52 S, 117/95, 117/160 R, 174/DIG. 3, 206/46 R, 220/64
[51] Int. Cl. ................B44d 1/02
[58] Field of Search ................220/64; 117/95, 94, 117/169; 174/DIG. 3, 68.5, 52 S; 206/46 R

[56] References Cited

UNITED STATES PATENTS

| | | | |
|---|---|---|---|
| 3,143,241 | 8/1964 | Howell | 220/64 |
| 3,078,006 | 2/1963 | Price et al. | 220/64 |
| 3,008,601 | 11/1961 | Cahne | 220/64 |
| 2,869,265 | 1/1959 | Klein | 29/527.4 |
| 3,202,542 | 8/1965 | Pote | 220/64 X |
| 3,079,136 | 2/1963 | Soine | 266/39 |
| 3,613,433 | 10/1971 | Deverell et al. | 117/95 |

*Primary Examiner*—Edward G. Whitby
*Attorney*—E. J. Holler and Richard B. Dence

[57] ABSTRACT

By rounding and/or rendering obtuse at least the vertical angles of the connecting walls in a ceramic cavity which come into contact with a noble metal coating or pad therein, "peel-back" of the noble metal coating or pad is prevented.

18 Claims, 7 Drawing Figures

PATENTED APR 17 1973

3,728,469

INVENTORS
FREDERICK RYBARCZYK
BY Richard B. Dence
E. J. Holler
ATTORNEYS

CAVITY STRUCTURE

This application relates to improved cavity structures. More particularly, this invention relates to improved cavity structures employed, for example, in microelectronic devices.

Ceramic structures have long been employed to encapsulate delicate equipment. Because of their strength, they protect the equipment from external sources of harm and because of their chemical and physical properties they serve as excellent substrates to which a wide variety of materials may be bonded.

One area in which these ceramic substrates are of particular importance is the microelectronics art. In many microelectronic devices, packages, subcomponents, etc. delicate electronic equipment such as silicon chip integrated circuits and the like are bonded within an encapsulating cavity located in the ceramic. Generally speaking, such equipment is bonded within the cavity by means of an intermediate adhesive or bonding material which is capable of forming a tenacious bond with both the equipment and the walls of the ceramic cavity which it contacts.

A particularly useful bonding material, especially for bonding silicon chip microelectronic integrated circuits to a substrate, has been a noble metal-glass binder coating or pad. The glass binder is employed to provide flow characteristics to the coating and to provide good adhesion with the ceramic substrate or further intermediate bonding material. The noble metal is employed, on the other hand, to provide good adhesion, often through the formation of a eutectic, with the electronic component.

Such a bonding material is usually formulated by admixing powdered noble metal and glass frit with an organic carrier vehicle consisting of a solvent and binder. The admixture is then thoroughly blended into a paste and applied to the cavity by drop or screen techniques. The paste is then heated to a relatively low temperature (e.g. about 100°–200° C) to remove the solvent and then to a higher temperature (i.e. the firing temperature) to remove the binder portion of the organic carrier vehicle and cause the glass binder to flow and the gold to sinter so as to form a solid, organic free, pad or coating.

FIGS. 1 and 2 illustrate the conventional design for encapsulating ceramic structures currently employed in the art. Generally speaking, such structures are comprised of a base ceramic 1 having located in a surface thereof, a cavity 3. Cavity 3 consists of a horizontal bottom surface 5 and vertically extending side walls 7. The angles of contact 9 between walls 7 and the angles of contact 11 between walls 7 and surface 5 are substantially right angles. That is to say, while these angles may be minutely rounded due to tool wear or the like, they are substantially sharp right angled corners.

FIG. 2 illustrates the problem of "peel-back" which occurs in these prior art structures when using noble metal bonding materials of conventional type as described above. When applying these bonding materials in paste form, the paste tends to wet walls 7 and cause a large miniscus 13 to form thereon. This miniscus remains during heating to remove the solvent and during heat-up to the firing temperature. As illustrated, during firing, miniscus 13, for reasons not entirely understood but believed to be related to metal shrinkage, cohesive forces and the like tends to peel back from walls 7. This peel-back can occur to only a portion of miniscus 13, as illustrated at 15, or it can cause a gap 17 to occur between wall 7 and the entire length of miniscus 13. Such a "peel-back" problem is extremely detrimental, especially in the microelectronics art where dimensional tolerances are so critical. In addition, peel-back tabs tend to flake off during use of the system, thus contaminating both physically and electrically (if the encapsulated component is electrical in nature) the encapsulated device. For example, if the encapsulated device is a typical multilead (e.g. 14 lead) silicon chip integrated circuit, the peel-back flake may cause electrical shorting and/or may physically damage the hair-like microleads formed between the chip and the macroleads.

It is a purpose of this invention to reduce, and in most instances substantially eliminate, the problem of "peel-back" as above described. This and other purposes and objectives readily apparent to the skilled artisan once given this disclosure are fulfilled by the following teachings of this invention both written and as illustrated wherein:

IN THE DRAWINGS

This invention, quite unexpectedly, substantially reduces, and in many instances totally eliminates, the problem of peel-back heretofore experienced in the prior art by providing a structural cavity which has substantially no sharp corners, at least in the vertical direction, and/or no substantial length of vertical wall, at those locations where the noble metal bonding material contacts the walls of the cavity. Preferably a structural cavity in accordance with this invention also has substantially no sharp corners in the horizontal direction as well. In those instances where the noble metal bonding material of this invention is applied to the entire area of the cavity so as to contact all walls, all corners and walls are formed in accordance with the above prescription. Where, however, the bonding material only contacts certain walls and not all, only those walls contacted need be specially formed as indicated.

Figures 1, 2:
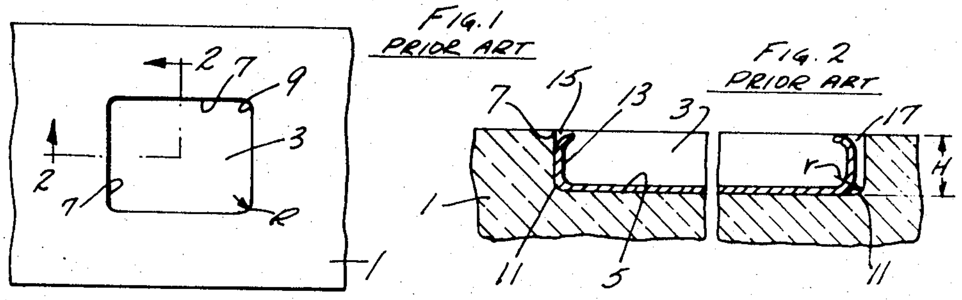
FIG. 1 is a top plane view of a typical prior art ceramic structure over which the structures of this invention constitute an improvement.
FIG. 2 is a partial side sectional view along and in the direction of section line 2—2 in FIG. 1.

FIGS. 1–2 illustrate that corners 9 and 11 of known prior art cavities are somewhat inherently rounded due to tool wear and the like. However, they are insufficiently rounded for the purposes of this invention due, of course, to the presence of the acute problem of peel-back experienced with these cavities. Thus for the purposes of this invention, corners 9 and 11 are considered "sharp" even though they are somewhat rounded.

As used herein the term "sharp" is defined as a corner insufficiently rounded to substantially reduce or eliminate the problem of peel-back. The term "substantially no sharp corners" therefore and as used herein, refers to corners which are sufficiently rounded or obtused to substantially reduce or eliminate the problem of peel-back.

The actual degree of rounding or obtusing necessary to effect the purposes of this invention will vary greatly as different cavities are employed, different bonding materials are used, and the like. Generally speaking, however, in those instances where the structural cavity is in a conventional ceramic (e.g. alumina) substrate used in the microelectronic art, and the bonding composition is a noble metal-glass binder system fireable at about 500°–1,000° C, the dimensional ratio r/H (as a measure of the rounding in the vertical plane) should be greater than about 0.2, preferably greater than about 0.5, and most preferably from about 0.8–1.0. As illustrated, *r* is the radius of the vertical round and H is the height of the miniscus. Since the miniscus even after firing is often as high as the cavity, H may be estimated as the height of the cavity.

As an alternative to or in combination with, rounding, the vertical angle of the walls to the bottom of the cavity should be greater than about 95°, more preferably greater than about 120° and most preferably on the order of about 135°.

While the vertical plane dimensions, as described above, are of paramount importance in achieving the desired results of this invention, it is also important in many environments and if peel-back is to be, for all substantial purposes, totally eliminated, to round or obtuse the corners in the horizontal plane as well. While the same discussion holds true with respect to widely varying ranges for horizontal design as for vertical design, it has generally been found in the ceramic substrate-noble metal coating environment, above-described, that the ratio R/H should be greater than about 2.0 and preferably on the order of about 4.0 or greater. As illustrated, R is the radius of horizontal round and H is again the height of the miniscus usually estimatable by the height of the cavity. Since the rectangular nature of the horizontal shape of the cavity is often an industrial requirement, ratios of about 4.0 have been found sufficient to effect the desired results and at the same time retain the rectangular nature of the cavity. In those instances where obtusing is possible, i.e. where the bonding material contacts only one or two corners and three or less walls, the angle of obtuse should be greater than about 100° and preferably about 115°–120°.

Such dimensions in both the vertical and the horizontal plane are in stark contrast to those of the conventional prior art. For example r/H in conventional cavities is usually less than about 0.2, while R/H is usually about 2.0 or less and $\alpha$ is substantially 90°.

As alluded to hereinabove, the concept of this invention finds utility in a wide variety of environments and cavities where peel-back is a problem. As is evident from the above, however, the preferred environment for the purposes of this invention is in the microelectronic circuitry art wherein a noble metal-glass binder bonding material firable from organic paste form at about 500°–1,000° C is called upon to bond a silicon chip integrated circuit or other delicate electronic device to a ceramic cavity bottom. The ceramic material may be any of the conventional materials such as steatite, fosterite, cordierite, porcelain, mullite, zirconia, and the like, but is preferably alumina. Particularly preferred noble metal-glass binder bonding materials useful to effect the purposes of this invention are those disclosed in my co-pending application Ser. No. 123,413 filed concurrently herewith and entitled NOBLE METAL, GLASS BINDER COMPOSITIONS AND METHODS OF USING SAME. While all compositions disclosed are useful, a particularly preferred paste composition within this copending application for the purposes of this invention consists of (a) about 65 percent by weight of solid particulate material consisting essentially of 4 percent by weight of a lead, barium borate glass binder and 96 percent by weight of gold and (b) about 35 percent by weight of a vehicle consisting essentially of about 92 percent by weight of a ½ weight ratio mixture of isoamyl salicylate to diethylene glycol monobutyl ether acetate and about 8 percent by weight of ethyl cellulose (as the organic binder). The glass binder composition preferably consists essentially of about by weight: 1% $SiO_2$, 13% $B_2O_3$, 82% PbO, and 4% BaO. The paste is first applied to the entire area of the cavities of this invention and a miniscus forms as illustrated. When heated to about 100°–200° C to drive off solvent, thereafter heated through a temperature of about 350°–400° C to remove organic binder and then fired at about 550°–1,000° C to form the final bonding structure substantially no peel-back can be detected. The entire disclosure of this copending application is incorporated herein by reference.

Figures 3, 4:
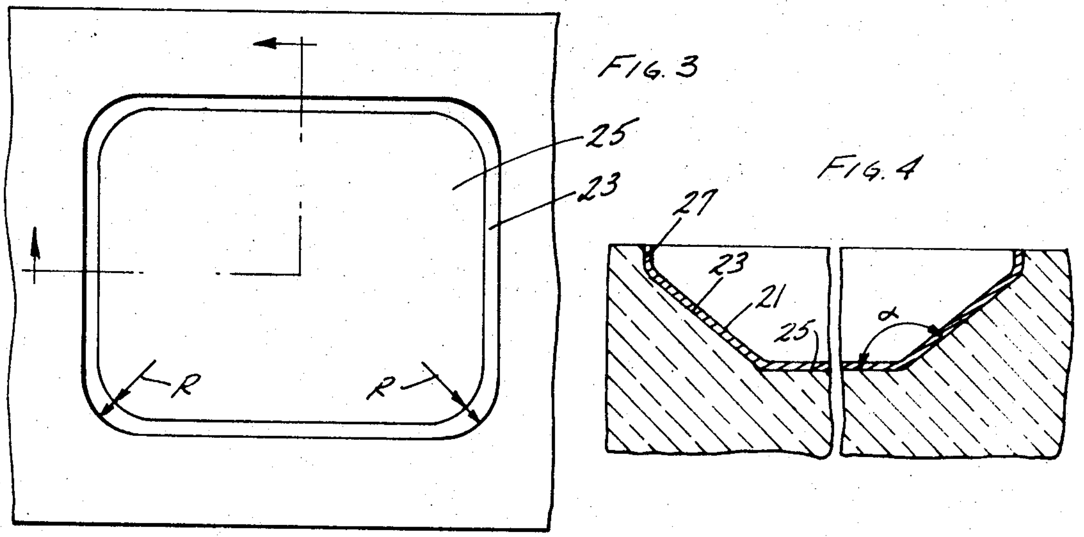
FIG. 3 is a top elevational view of certain embodiments of this invention.
FIG. 4 is an enlarged fragmentary side sectional view, along the and in the direction of the sectional plane of FIG. 3, of one embodiment of this invention.

FIGS. 3–7 illustrate several embodiments of the cavity structures of this invention particularly suitable in the above-described preferred environment and having located therein the preferred gold die bonding pad 21 formed as discussed in the preceeding paragraph (Pad 21 is not shown in FIG. 3). Typical dimensions for such a cavity are a cavity length of about 0.146″ ± 0.003 inches, a cavity width of about 0.116″ +0.002 or −0.006 inches, a cavity depth of about 0.005 inches and a substrate thickness of about 0.075 inches.

Figure 5:
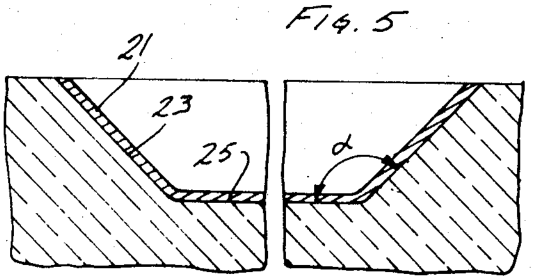
FIG. 5 is an enlarged, fragmentary side sectional view, along the and in the direction of the sectional plane of FIG. 3, of another embodiment of this invention.

FIGS. 3–5 illustrate the alternative of obtusing angles $\alpha$ between walls 23 and bottom 25 of the cavity. As illustrated, obtuse angle $\alpha$ is preferably 135°. FIG. 3 further illustrates the rounding of all corners in the horizontal plane to the extent where both R/H 's (internal and external) meet the above discussed requirements. FIG. 4 illustrates a structure to meet certain commercial requirements that the upper length and width dimensions of the cavity be the same for a substantial depth so as to be able to insert a closely fitting rectangular closure cap therein. To meet the requirements of this invention the depth of vertical section 27 of wall 23 should preferably not be greater than about 50 percent of the total depth of the cavity and preferably less than about 20 percent. A most preferred embodiment for the purposes of maximizing insurance against peel-back is illustrated in FIG. 5 wherein section 27 is non-existent. In such an embodiment, the closure cap is designed to the cavity rather than vice versa.

Figure 6:
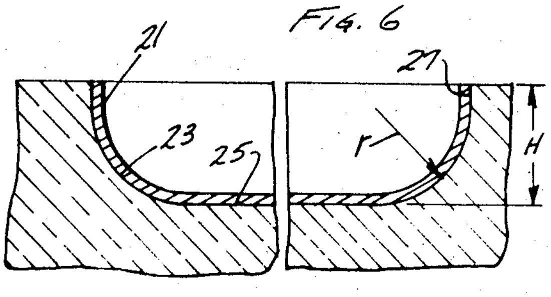
FIG. 6 is an enlarged, fragmentary side sectional view of a further embodiment of this invention.
Figure 7:
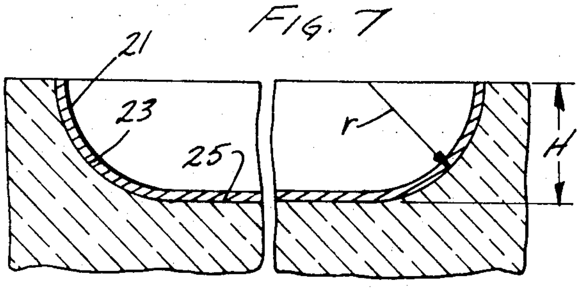
FIG. 7 is an enlarged, fragmentary side sectional view of still another embodiment of this invention.

FIGS. 6–7 illustrate the alternative of rounding rather than obtusing the angles between walls 23 and cavity bottom 25. Like FIG. 4, FIG. 6 illustrates a structure to meet the described commercial requirements set forth above which necessitate the use of a vertical wall section 27. The same limits for the depth of section 27 apply for this embodiment as applied for the embodiment of FIG. 4. Further and similar to FIG. 5, FIG. 7 represents the most preferred embodiment for the purposes of maximizing insurance against peel-back, since FIG. 7 eliminates section 27 altogether.

It is understood that the illustrated cavities are by no means exhaustive of the cavity designs which could be employed or the shape of the pads employed. Quite to the contrary, once given the unique and surprising generic concept upon which this invention is based many other features, modifications, and improvements will become apparent to the skilled artisan. Such other features, modifications, and improvements are therefore considered to be a part of this invention, the scope of which is to be determined by the following claims:

I claim:

1. In an electronic microcircuit package of the type including a base member defining a cavity bounded by a bottom surface and adjoining side wall surfaces receptive of a coating of adherent bonding material adapted to bond an electronic microcircuit component within the confines of said cavity, the improvement wherein said bottom and side wall surfaces converge together in such manner as to define an outwardly rounded or obtused junction therebetween.

2. An article according to claim 1 wherein the junction of said walls and said bottom surface is outwardly obtuse to define an angle greater than about 95°.

3. An article according to claim 2 wherein said angle is greater than about 120°.

4. An article according to claim 2 wherein said angle is about 135°.

5. An article according to claim 1 wherein the junction of said side wall which will be in contact with said bonding material and said bottom surface is rounded to the extent that the ratio r/H is greater than about 0.2; wherein *r* is the radius of said junction and H is the height of the material which will be on said side wall.

6. An article according to claim 5 wherein said ratio is greater than about 0.5.

7. An article according to claim 5 wherein said ratio is about 0.8–1.0.

8. An article according to claim 1 wherein said cavity includes a plurality of adjoining side walls surrounding said cavity, and said bonding material will contact substantially all of said surrounding walls and substantially the entire bottom surface of said cavity, and wherein the junctions formed by each of said adjoining side walls are rounded to the extent that R/H is greater than about 2.0; wherein R is the radius of each of said junctions between said side walls and H is the height of the material which will be on said side walls.

9. An article according to claim 8 wherein said ratio is about 4.0.

10. The improvement as defined in claim 1, wherein said junction is rounded to define a radius about 0.02 inch.

11. The improvement as defined in claim 1, wherein said junction is rounded and defines a radius of about 0.004 – 0.005 inch.

12. The improvement as defined in claim 1, wherein said electronic microcircuit component is a silicon chip and said bonding material is comprised of gold.

13. An article of manufacture comprising a base member provided with a substantially rectangular cavity defined by a bottom surface and surrounding walls, said cavity having a length of about 0.146 inch, a width of about 0.116 inch, and a depth of about 0.005 inch, said cavity being adapted to receive a layer of a material in contact with at least a portion of said bottom surface and at least a portion of said walls, the junction of said walls and said bottom surface in contact with said material being rounded or obtused to an extent sufficient to at least substantially limit any peel-back of said material in contact with said cavity walls and bottom surface.

14. An article according to claim 13 wherein the junction formed by adjacent walls are rounded to a radius of about 0.02 inch.

15. An article according to claim 14 wherein the junction of said walls and said bottom surface is rounded to a radius of about 0.004–0.005 inch.

16. An article according to claim 15 wherein said article is a substrate for encapsulating within said cavity a silicon chip integrated circuit connected to said substrate by a gold-glass binder pad.

17. An article according to claim 13 wherein the angle formed at the junction of said walls and said bottom surface is outwardly obtuse and is about 135°.

18. An article according to claim 13, wherein said junction is outwardly obtuse and defines an angle of greater than about 95°.

* * * * *